(12) United States Patent
Kurokawa

(10) Patent No.: US 7,974,794 B2
(45) Date of Patent: Jul. 5, 2011

(54) ELECTRIC ENERGY METER

(75) Inventor: Fuyuki Kurokawa, Kanagawa (JP)

(73) Assignee: Toshiba Toko Meter Systems Co., Ltd., Tokyo (JP)

( * ) Notice: Subject to any disclaimer, the term of this patent is extended or adjusted under 35 U.S.C. 154(b) by 544 days.

(21) Appl. No.: 11/951,625

(22) Filed: Dec. 6, 2007

(65) Prior Publication Data

US 2009/0177421 A1 Jul. 9, 2009

(51) Int. Cl.
- *G01R 11/067* (2006.01)
- *G01R 11/073* (2006.01)
- *G01R 11/00* (2006.01)
- *G01R 27/02* (2006.01)

(52) U.S. Cl. .............. 702/61; 702/57; 702/62; 702/64

(58) Field of Classification Search ............... 702/60, 702/61, 77, 99, 120, 158, 175; 307/64; 324/103 R; 700/297
See application file for complete search history.

(56) References Cited

U.S. PATENT DOCUMENTS

| | | | |
|---|---|---|---|
| 4,034,290 A * | 7/1977 | Warren | 324/110 |
| 4,591,782 A * | 5/1986 | Germer | 324/103 R |
| 5,684,710 A * | 11/1997 | Ehlers et al. | 700/293 |
| 6,252,389 B1 | 6/2001 | Baba et al. | |
| 6,365,990 B2 * | 4/2002 | Flegel | 307/64 |
| 6,792,364 B2 * | 9/2004 | Jonker et al. | 702/61 |
| 2002/0084914 A1 | 7/2002 | Jackson et al. | |

FOREIGN PATENT DOCUMENTS

| | | |
|---|---|---|
| JP | 62-12869 | 1/1987 |
| JP | 62-189666 | 12/1987 |
| JP | 09-304442 | 11/1997 |

OTHER PUBLICATIONS

Japanese Office Action issued on Nov. 4, 2010 in the counterpart Japanese application 2006-215448.
Office Action dated Oct. 12, 2010 in the counterpart Canadian application No. 2,613,811.

* cited by examiner

*Primary Examiner* — Mohamed Charioui
*Assistant Examiner* — Felix E Suarez
(74) *Attorney, Agent, or Firm* — Oblon, Spivak, McClelland, Maier & Neustadt, L.L.P.

(57) ABSTRACT

An electric energy meter comprises a terminal unit and a measurement unit. The terminal unit includes plural electric lines each of which carries an electric current supplied from an external power source to a load, and a coil which is provided to at least one of the plural electric lines and converts the electric current flowing to the load into a magnetic field directly proportional to the electric current. The measurement unit includes a hall element which generates a voltage directly proportional to the magnetic field converted by the coil, a voltage detector which detects voltages of the plural electric lines, and a processing unit which calculates electric energy consumption based on the voltage generated by the hall element and the voltages detected by the voltage detector. The electric energy meter can facilitate the replacement.

4 Claims, 5 Drawing Sheets

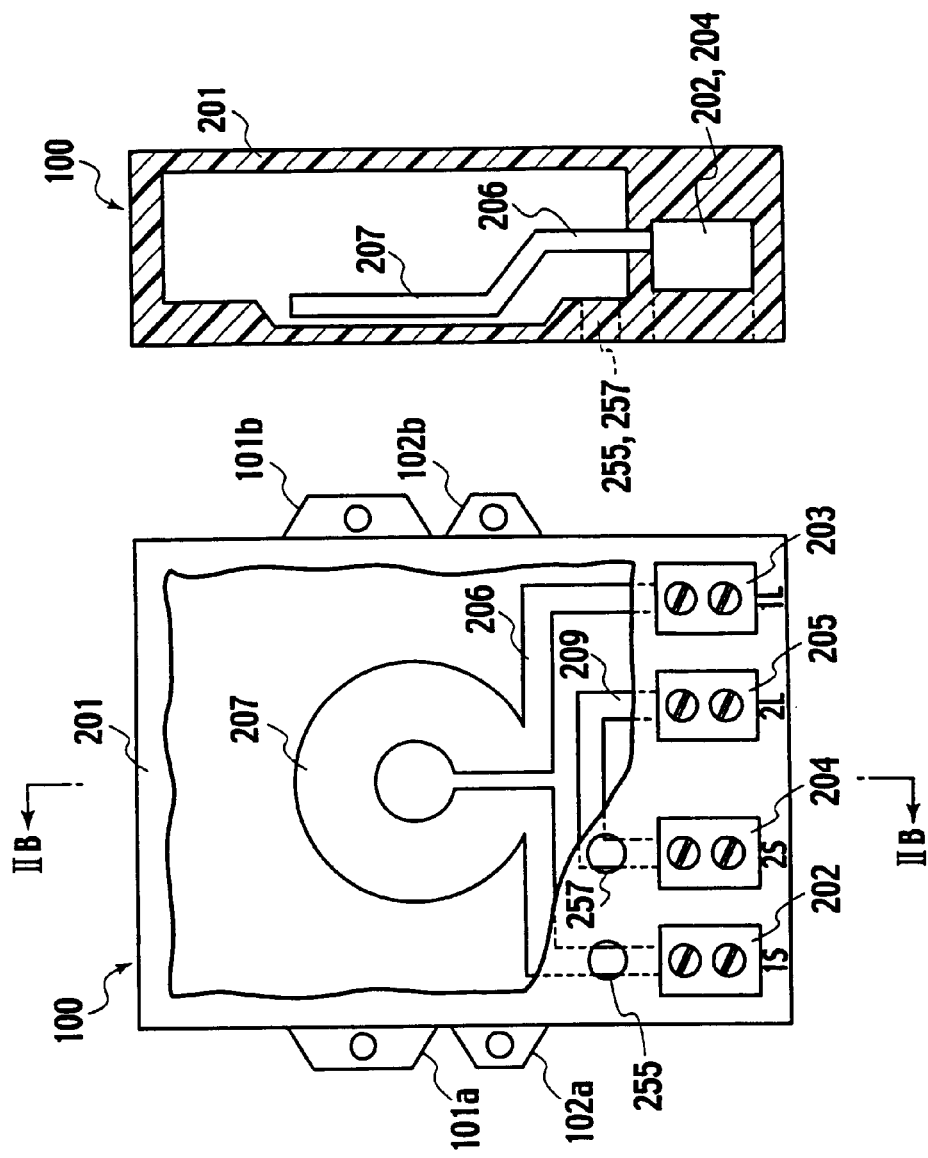

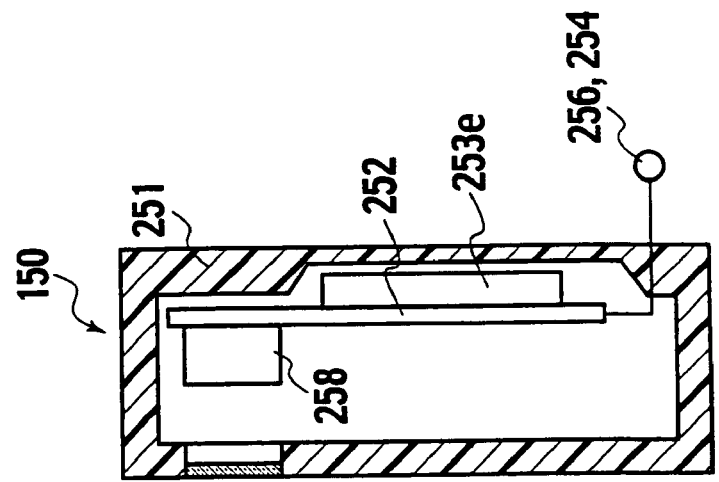
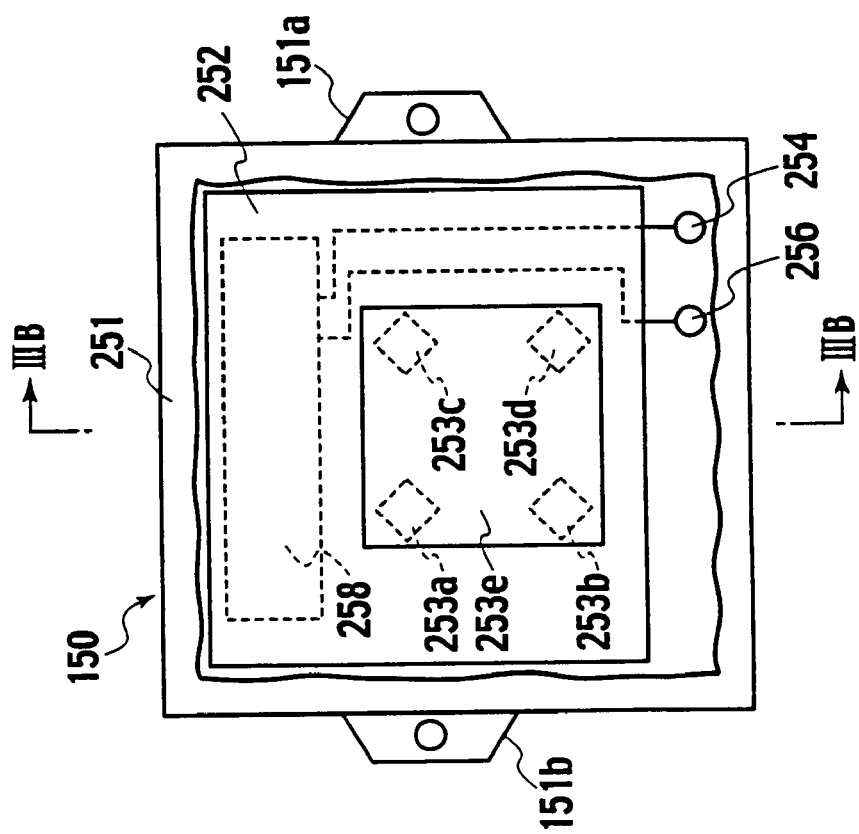

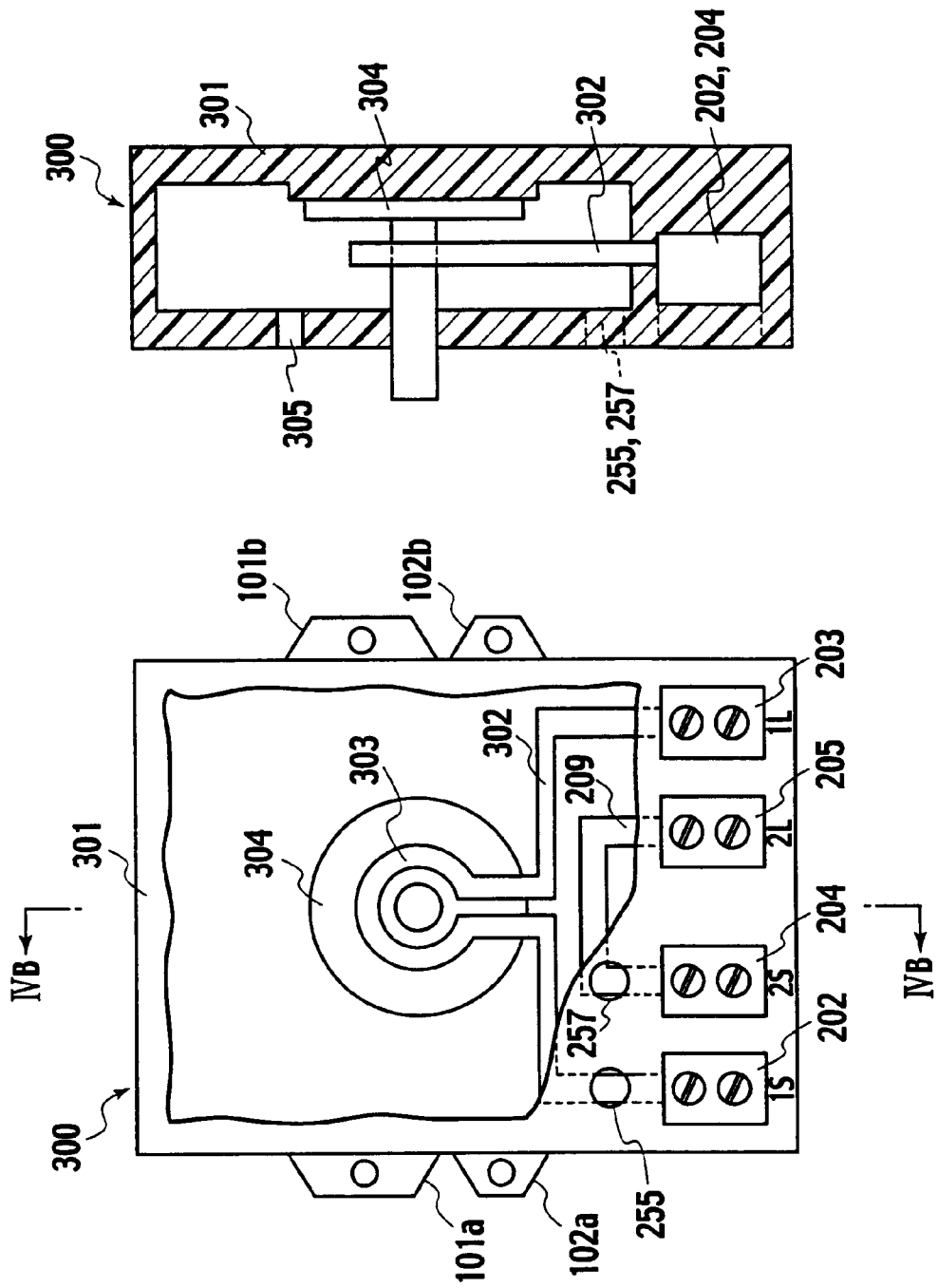

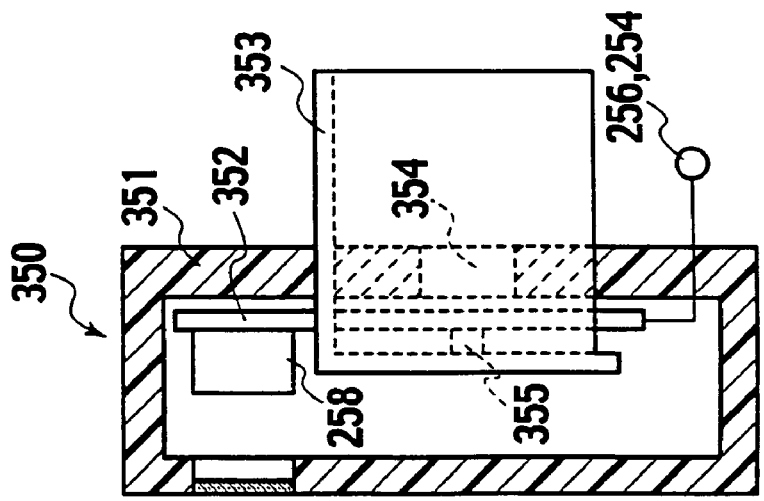
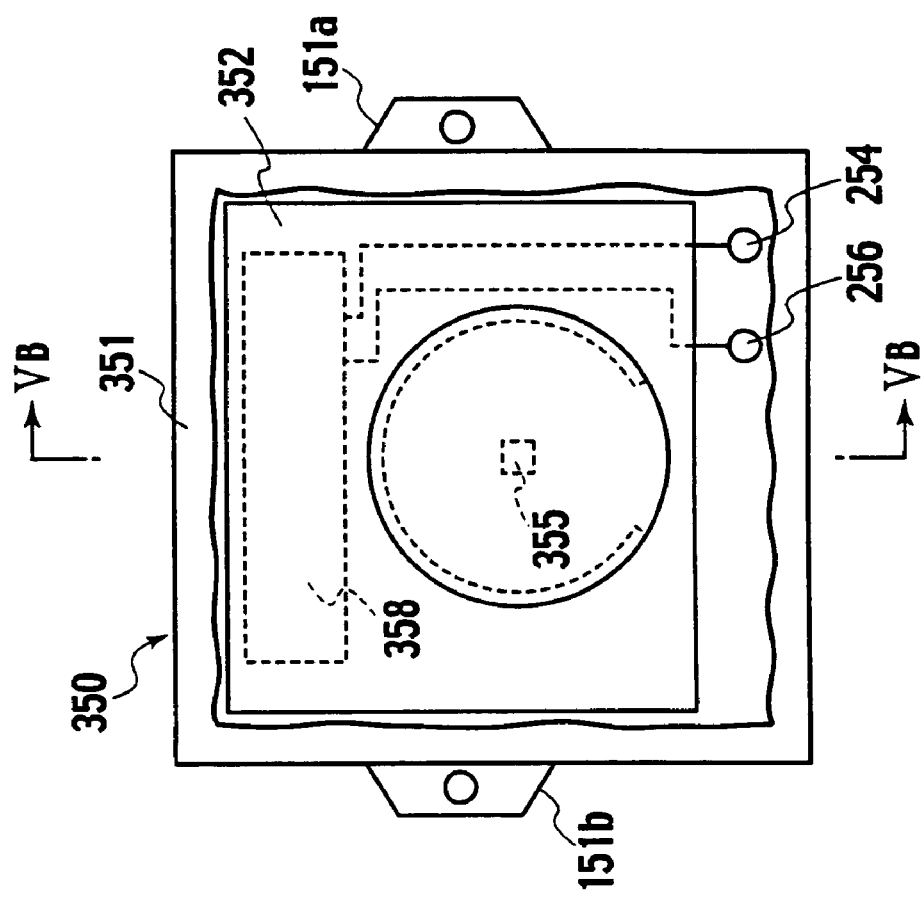

ELECTRIC ENERGY METER

BACKGROUND OF THE INVENTION

1. Field of the Invention

The present invention relates to an electric energy meter that measures electric energy consumption of a measured system.

2. Description of the Related Art

Electric energy meters that measure user's electric energy consumption are employed for transactions of electric charges. The electric energy meters have validity periods set by a sanction system under regulations or laws. The electric energy meters must be replaced when the validity periods have elapsed. At the replacement, the fixed electric energy meter must be removed from an electric supply line. When the electric energy meter is removed, the electric supply line dangles, which makes the replacing operation difficult. Since the replacing operation is sometimes performed in an energized state, it would be difficult to perform the replacing operation. An electric energy meter for enhancing the workability at the replacement has been disclosed in Japanese Patent Application Laid-open No. S62-12869. The electric energy meter includes a main unit and a terminal unit provided separately from the main unit.

SUMMARY OF THE INVENTION

In the conventional electric energy meter, many screws of the terminal unit must be detached and attached at the replacement. Accordingly, the operation is too troublesome to frequently replace the electric energy meter. Therefore, an object of the present invention is to provide an electric energy meter that facilitates the replacement.

A first aspect of the present invention provides an electric energy meter which comprises a terminal unit and a measurement unit. The terminal unit includes plural electric lines each of which carries an electric current supplied from an external power source to a load, and a coil which is provided to at least one of the plural electric lines and converts the electric current flowing to the load into a magnetic field directly proportional to the electric current. The measurement unit includes a hall element which generates a voltage directly proportional to the magnetic field converted by the coil, a voltage detector which detects voltages of the plural electric lines, and a processing unit which calculates electric energy consumption based on the voltage generated by the hall element and the voltages detected by the voltage detector.

A second aspect of the present invention provides an electric energy meter which comprises a terminal unit and a measurement unit. The terminal unit includes plural electric lines each of which carries an electric current supplied from an external power source to a load, a coil which is provided to at least one of the plural electric lines and converts the electric current flowing to the load into a magnetic field directly proportional to the electric current, and a first magnetic material by which the magnetic field converted by the coil is conducted. The measurement unit includes a hall element which generates a voltage directly proportional to the magnetic field converted by the coil, a second magnetic material which is combined with the first magnetic material and conducts the magnetic field converted by the coil to the hall element, a voltage detector which detects voltages of the plural electric lines, and a processing unit which calculates electric energy consumption based on the voltage generated by the hall element and the voltages detected by the voltage detector.

BRIEF DESCRIPTION OF THE DRAWINGS

FIG. 2A is a front view of a terminal unit according to the first embodiment;

FIG. 2B is a sectional view taken along a line IIB-IIB of FIG. 2A;

FIG. 3A is a back view of a measurement unit according to the first embodiment;

FIG. 3B is a sectional view taken along a line IIIB-IIIB of FIG. 3A;

FIG. 4A is a front view of a terminal unit according to a second embodiment of the present invention;

FIG. 4B is a sectional view taken along a line IVB-IVB of FIG. 4A;

FIG. 5A is a back view of a measurement unit according to the second embodiment; and FIG. 5B is a sectional view taken along a line VB-VB of FIG. 5A.

DETAILED DESCRIPTION OF THE EMBODIMENT

Figure 1:
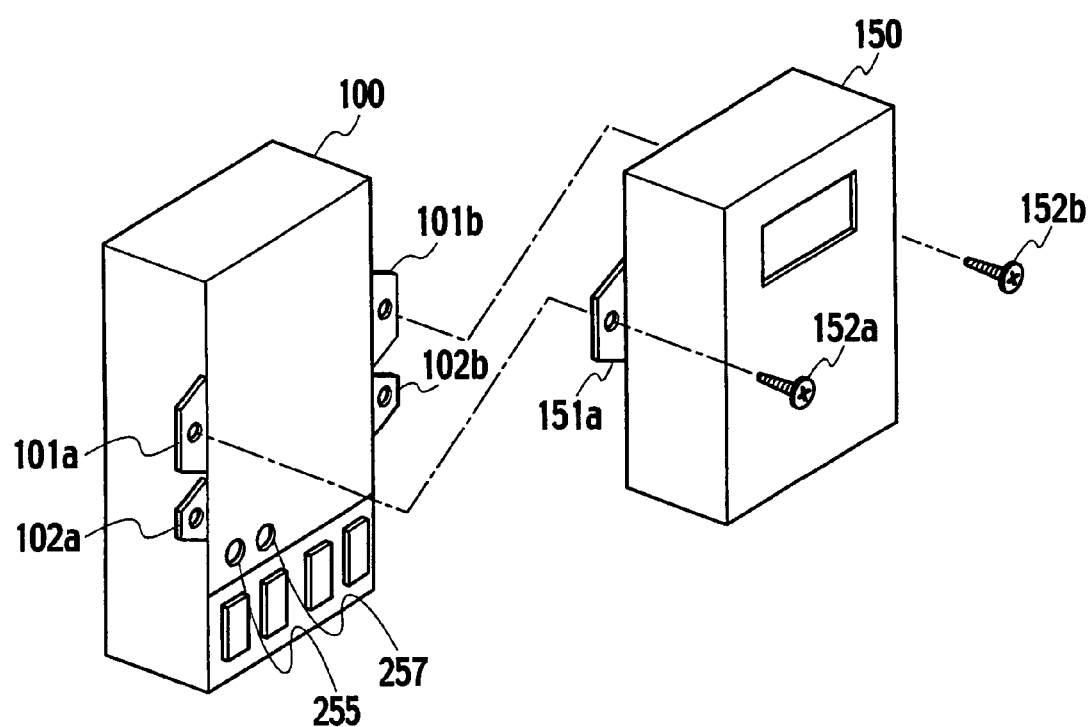
FIG. 1 is a separated perspective view of an electric energy meter according to a first embodiment of the present invention.

Electric energy meters according to embodiments of the present invention are explained below.

An electric energy meter according to a first embodiment of the present invention is explained with reference to FIGS. 1 to 3B. The electric energy meter according to the first embodiment is a single-phase two-wire type.

The electric energy meter is configured by combining a terminal unit 100 and a measurement unit 150 as shown in FIG. 1. The measurement unit 150 contains a measurement circuit that measures and displays electric energy consumption. Fixing tabs 151a, 151b of the measurement unit 150 are fixed to fixing tabs 101a, 101b of the terminal unit 100 with screws 152a, 152b, respectively. The measurement unit 150 is detachable from the terminal unit 100.

A configuration of the terminal unit 100 is explained with reference to FIGS. 2A and 2B. FIG. 2A illustrates the terminal unit 100 from which an outer plate is partially removed to better show inside of the unit.

As shown in FIG. 2A, a terminal unit casing 201 is composed of resin or the like, and holds components. A first supply terminal 202 is composed of conductive metal, and a first supply line connecting to an external power source is connected thereto. A first load terminal 203 is composed of conductive metal, and a first load line connecting to a user-side load is connected thereto. A second supply terminal 204 is composed of conductive metal, and a second supply line connecting to the external power source is connected thereto. A second load terminal 205 is composed of conductive metal, and a second load line connecting to the user-side load is connected thereto.

A first electric line 206 is composed of a copper single wire or the like. One end of the first electric line 206 is connected to the first supply terminal 202, and the other end thereof is connected to the first load terminal 203. The first electric line 206 carries an electric current from the source side to the load side. The first electric line 206 has a coil 207 in the middle. The coil 207 may have one turn or plural turns. The first electric line 206 is covered by the terminal unit casing 201, and cannot be seen directly from outside. The terminal unit casing 201 has a coil recess 208 at which the resin wall of the terminal unit casing 201 is thinner. As shown in FIG. 2B, the coil 207 is offset forward to be fitted in the coil recess 208.

A second electric line 209 is composed of a copper single wire or the like. One end of the second electric line 209 is connected to the second supply terminal 204, and the other end thereof is connected to the second load terminal 205. The second electric line 209 carries an electric current from the source side to the load side.

A configuration of the measurement unit 150 is explained with reference to FIGS. 3A and 3B. FIG. 3A illustrates the measurement unit 150 from which an outer plate is partially removed to better show inside of the unit.

As shown in FIG. 3A, a measurement unit casing 251 is composed of weatherproof resin such as polycarbonate, and covers inner electronic components and the like. The electronic components and the like are mounted on a printed circuit board (PCB) 252.

Hall elements 253a, 253b, 253c, and 253d are composed of semiconductors. The hall elements 253a, 253b, 253c, and 253d are packaged in an element package 253e. The element package 253e is mounted on the PCB 252. The hall elements 253a, 253b, 253c, and 253d are positioned closely to the coil 207 in the terminal unit 100 when the measurement unit 150 is attached to the terminal unit 100. The electric current flowing from the first supply terminal 202 to the first load terminal 203 is converted into a directly proportional voltage by the hall elements 253a, 253b, 253c, and 253d.

A first voltage terminal 254 is composed of conductive metal. The first voltage terminal 254 is electrically connected to the first electric line 206 in the terminal unit 100. A voltage externally supplied to the first supply terminal 202 is detected by the first voltage terminal 254. The first voltage terminal 254 contacts the first electric line 206 via a through hole 255 of the terminal unit 100. The first voltage terminal 254 keeps the contact state due to elasticity of the metallic material.

A second voltage terminal 256 is composed of conductive metal. The second voltage terminal 256 is electrically connected to the second electric line 209 in the terminal unit 100. A voltage externally supplied to the second supply terminal 204 is detected by the second voltage terminal 256. The second voltage terminal 256 contacts the second electric line 209 via a through hole 257 of the terminal unit 100. The second voltage terminal 256 keeps the contact state due to elasticity of the metallic material.

A processing unit 258 is composed of semiconductor components such as an A/D converter and a microcomputer. The processing unit 258 multiplies a voltage outputted from the hall elements 253a, 253b, 253c, and 253d (voltage directly proportional to the electric current flowing from the first supply terminal 202 to the first load terminal 203) by a voltage between the first supply terminal 202 and the second supply terminal 204 (which is detected by the first voltage terminal 254 and the second voltage terminal 256), to obtain electric energy consumption of the measured system. The processing unit 258 displays the obtained electric energy consumption.

An operation according to the first embodiment is explained hereinafter.

The terminal unit 100 is attached to a wall or the like of a user's house. A supply line from an electric supply company is connected to the first supply terminal 202 and the second supply terminal 204. A supply line for supplying electric power to indoor loads is connected to the first load terminal 203 and the second load terminal 205. At the expiration of the validity period or switching to another electric supply company, the terminal unit 100 is left on the wall of the user's house and only the measurement unit 150 is replaced. The replacement is achieved by detaching an old measurement unit 150 from the terminal unit 100, and attaching a new measurement unit 150 to the terminal unit 100.

Next, attaching the measurement unit 150 is explained. Initially, the measurement unit 150 is overlapped over the terminal unit 100 fixed on the wall of the user's house. The fixing tabs 151a, 151b of the measurement unit 150 are then fixed to the fixing tabs 101a, 101b of the terminal unit 100 with the screws 152a, 152b. The screws 152a, 152b are tamper-evident screws, each of which has a wire. Each of the wire (not shown) is fixed to tab 102a, 102b to establish tamper-evident sealing, and guarantees unsealing. The measurement unit 150 is fixed to the terminal unit 100 in the procedure as mentioned above.

When the measurement unit 150 is fixed to the terminal unit 100, the first and second voltage terminals 254, 256 of the measurement unit 150 are electrically connected to the first and second electric lines 206, 209 via the through holes 255, 257 provided to the terminal unit 100, respectively. The voltage between the first supply terminal 202 and the second supply terminal 204 is detected by the processing unit 258 via the first voltage terminal 254 and the second voltage terminal 256.

The hall elements 253a, 253b, 253c, and 253d of the measurement unit 150 are magnetically coupled with the coil 207 of the terminal unit 100, and detect magnetic flux according to the electric current flowing through the first electric line 206 to generate a voltage directly proportional to the current. The voltage is detected by the processing unit 258.

The hall elements 253a, 253b, 253c, and 253d are arranged symmetrically to each other on a substrate, and respective output signals are connected in parallel. A method of connecting the hall elements arranged on a substrate is so-called orthogonal connection, and reduces influence by an offset voltage of the hall elements. The hall elements 253a, 253b, 253c, and 253d formed on the substrate are packaged in the element package 253e. The hall elements 253a, 253b, 253c, and 253d are driven by a DC voltage source (not shown).

The hall elements 253a, 253b, 253c, and 253d are located outward of the inner edge of the coil 207 in the terminal unit 100 and inward of the outer edge thereof. The hall elements 253a, 253b, 253c, and 253d detect a magnetic field parallel to a chip plane. Since the hall elements 253a, 253b, 253c, and 253d are arranged in the positions above mentioned, the hall elements 253a, 253b, 253c, and 253d can be positioned within magnetic force lines generated by the coil 207 and can achieve strong magnetic coupling.

Furthermore, since the resin at the coil recess 208 of the terminal unit casing 201 is thin, the strong magnetic coupling between the hall elements 253a, 253b, 253c, and 253d and the coil 207 can be achieved.

The detachment of the measurement unit 150 is explained next. As described above, since the electric energy meter is employed for transactions of electric charges, the validity period is set by regulations or the like. At the expiration of the validity period, the electric energy meter must be replaced. The replacement is also required if the electric energy meter gets out of order. At the detachment of the measurement unit 150, the wires (not shown) of the tamper-evident screws are removed from the tabs 102a, 102b, and the screws 152a, 152b fixing the measurement unit 150 to the terminal unit 100 are removed. The measurement unit 150 is then detached from the terminal unit 100. The first and second voltage terminals 254, 256 simply contact the first and second electric lines 206, 209, respectively, and the hall elements 253a, 253b, 253c, and 253d are simply magnetically coupled with the coil 207.

Therefore, the measurement unit 150 can be detached from the terminal unit 100 without any difficulty after the two screws 152a, 152b have been removed.

A second embodiment of the present invention is explained with reference to FIGS. 4A to 5B. An electric energy meter according to the second embodiment is a single-phase two-wire type. FIGS. 4A and 5A illustrate units from each of which an outer plate is partially removed to better show inside of the units.

According to the first embodiment, the magnetic field generated by the coil 207 of the terminal unit 100 is directly applied to the hall elements 253a, 253b, 253c, and 253d of the measurement unit 150. According to the second embodiment, a magnetic field generated by a coil of a terminal unit acts on a hall element of a measurement unit through a magnetic core made of iron or the like.

The electric energy meter according to the second embodiment is configured by combining a terminal unit 300 (FIGS. 4A and 4B) and a measurement unit 350 (FIGS. 5A and 5B). The measurement unit 350 contains a measurement circuit that measures and displays electric energy consumption. The measurement unit 350 is detachable from the terminal unit 300.

As shown in FIGS. 4A and 4B, a terminal unit casing 301 is composed of resin or the like, and holds components. A first electric line 302 is composed of a copper single wire or the like. One end of the first electric line 302 is connected to the first supply terminal 202, and the other end thereof is connected to the first load terminal 203. The first electric line 302 carries an electric current from the source side to the load side. The first electric line 302 has a coil 303 in the middle. The coil 303 may have one turn or plural turns.

A first core 304 is composed of a magnetic material such as metal or the like. The first core 304 has a shape obtained by combining a circular plate and a cylinder. The first core 304 is fixed to the terminal unit casing 301 so that it may pass through the center of the coil 303 in the terminal unit 300 and protrudes from the terminal unit 300. The first core 304 is combined with a second core 353 (which is explained later) in the measurement unit 350 to configure a core unit. The core unit transmits a magnetic field generated by the coil 303 in the terminal unit 300 to a hall element 355 (which is explained later).

As shown in FIGS. 5A and 5B, a measurement unit casing 351 is composed of weatherproof resin such as polycarbonate, and covers inner electronic components and the like. The electronic components and the like are mounted on a PCB 352. The PCB 352 has a C-shaped slit (not shown) to pass through the second core 353 (which is explained later) therein.

The second core 353 is composed of a magnetic material such as metal or the like. The second core 353 has a shape obtained by removing a sidewall partially from a cylindrical cup. The removed part of the sidewall is formed so that the electric line 302 of the terminal unit 300 passes therethrough. The second core 353 is fixed to the measurement unit casing 351 so that an opposite end against its bottom may be protruded from the measurement unit 350. The second core 353 surrounds the coil 303 when the measurement unit 350 is attached to the terminal unit 300.

At the back of the measurement unit casing 351, a circular opening 354 (FIG. 5B) is formed to pass through the protruded first core 304 therein. A C-shaped slit 305 (FIG. 4B) is provided with the terminal unit casing 301 to pass through the protruded second core 353 therein.

The hall element 355 is composed of a semiconductor. The hall element 355 receives a magnetic field generated by the coil 303 of the terminal unit 300 via the core unit configured by the first core 304 and the second core 353. An electric current flowing from the first supply terminal 202 to the first load terminal 203 is converted into a directly proportional voltage by the hall element 355. The hall element 355 is mounted on the PCB 352 to contact the second core 353. The hall element 355 detects a magnetic field perpendicular to a chip plane.

A first voltage terminal 254 is composed of conductive metal. The first voltage terminal 254 is electrically connected to the first electric line 302 in the terminal unit 300. A voltage externally supplied to the first supply terminal 202 is detected by the first voltage terminal 254. The first voltage terminal 254 contacts the first electric line 302 via a through hole 255 of the terminal unit 300. The first voltage terminal 254 keeps the contact state due to elasticity of the metallic material.

A second voltage terminal 256 is composed of conductive metal. The second voltage terminal 256 is electrically connected to the second electric line 209 in the terminal unit 300. A voltage externally supplied to the second supply terminal 204 is detected by the second voltage terminal 256. The second voltage terminal 256 contacts the second electric line 209 via a through hold 257 of the terminal unit 300. The second voltage terminal 256 keeps the contact state due to elasticity of the metallic material.

A processing unit 258 is composed of semiconductor components such as an A/D converter and a microcomputer. The processing unit 258 multiplies a voltage outputted from the hall element 355 (voltage directly proportional to the electric current flowing from the first supply terminal 202 to the first load terminal 203) by a voltage between the first supply terminal 202 and the second supply terminal 204 (which is detected by the first voltage terminal 254 and the second voltage terminal 256), to obtain electric energy consumption of the measured system. The processing unit 258 displays the obtained electric energy consumption.

When the measurement unit 350 is attached to the terminal unit 300, the second core 353 contacts the first core 304 passing through the center of the coil 303 to form a so-called pod-core. A magnetic field generated by the coil 303 of the first electric line 302 acts on the hall element 355 via the pod-core. The pod-core establishes stronger magnetic coupling between the hall element 355 and the coil 303.

A method of attaching/detaching the measurement unit 350 to/from the terminal unit 300 is the same as that in the first embodiment. The first and second voltage terminals 254, 256 simply contact the first and second electric lines 302, 209, respectively, and the first and second cores 304, 353 are simply combined. Accordingly, the measurement unit 350 can be detached from the terminal unit 300 without any difficulty after the two screws 152a, 152b have been removed.

The replacement of the electric energy meter is needed at the expiration of the validity period set by the sanction system, and the frequency of the replacement was long such as ten years. The user used to be able to purchase electric power only from one electric power company, and hardly had a chance of switching to the other electric power company in the middle of the validity period. Therefore, the replacement in the middle of the validity period is hardly needed. However, electricity deregulation has been promoted, so that new electric supply companies can also sell electric power. Users can freely select an electric supply company. In many cases, the electric supply company owns property of the electric energy meter. Therefore, the electric energy meter may be replaced at the switching of the electric supply company. It may be happened that the user changes the electric supply company frequently to take further advantage in electric charges or services. Furthermore, functions required for the electric energy meters may differ according to the electric supply companies because the electric supply companies would supply the users with distinct charging menus or services. Consequently, standardization of the electric energy meters may be difficult. In the conventional electric energy meter, many screws of the terminal unit had to be detached and attached at the replacement. Therefore, the operation used to be troublesome to frequently replace the electric energy meter.

According to the above embodiments, the measurement unit 150, 350 can be replaced by detaching and attaching fewer screws. According to the above embodiments, only the measurement unit 150, 350 can be replaced. Therefore, unlike in the conventional replacing operation, the electric supply line does not dangle, and the operation is easy to perform.

What is claimed is:

1. An electric energy meter for measuring electric energy consumption through a plurality of electric lines, each of which carries an electric current supplied from an external power source to a load, the meter comprising:
   a terminal unit that is fixedly connected with the plurality of electric lines and includes
      a coil which is connected to at least one of the plurality of electric lines and converts the electric current flowing to the load into a magnetic field directly proportional to the electric current; and
   a measurement unit that is detachably coupled with the terminal unit and includes
      a hall element which is magnetically coupled with the coil to generate a voltage directly proportional to the magnetic field converted by the coil,
      a voltage detector which detects voltages of the plurality of electric lines, and
      a processing unit which calculates the electric energy consumption based on the voltage generated by the hall element and the voltages detected by the voltage detector.

2. The electric energy meter according to claim 1, wherein the hall element is placed outward of an inner edge of the coil and inward of an outer edge of the coil.

3. The electric energy meter according to claim 2, wherein the hall element is provided in a plurality on one substrate symmetrically.

4. An electric energy meter for measuring electric energy consumption through a plurality of electric lines, each of which carries an electric current supplied from an external power source to a load, the meter comprising:
   a terminal unit that is fixedly connected with the plurality of electric lines and includes
      a coil which is connected to at least one of the plurality of electric lines and converts the electric current flowing to the load into a magnetic field directly proportional to the electric current, and
      a first magnetic material by which the magnetic field converted by the coil is conducted; and
   a measurement unit that is detachably coupled with the terminal unit and includes
      a hall element which is magnetically coupled with the coil to generate a voltage directly proportional to the magnetic field converted by the coil,
      a second magnetic material which is combined with the first magnetic material and conducts the magnetic field converted by the coil to the hall element,
      a voltage detector which detects voltages of the plurality of electric lines; and
      a processing unit which calculates the electric energy consumption based on the voltage generated by the hall element and the voltages detected by the voltage detector.

* * * * *